(12) United States Patent
Kondapalli et al.

(10) Patent No.: US 7,518,396 B1
(45) Date of Patent: Apr. 14, 2009

(54) APPARATUS AND METHOD FOR RECONFIGURING A PROGRAMMABLE LOGIC DEVICE

(75) Inventors: Venu M. Kondapalli, Sunnyvale, CA (US); Wei Guang Lu, San Jose, CA (US); P. Hugo Lamarche, Campbell, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/823,057

(22) Filed: Jun. 25, 2007

(51) Int. Cl.
*G06F 7/38* (2006.01)
*H03K 19/173* (2006.01)
*H03K 17/693* (2006.01)

(52) U.S. Cl. .......................... 326/38; 716/16
(58) Field of Classification Search ............. 326/37–41, 326/47; 716/16
See application file for complete search history.

(56) References Cited

U.S. PATENT DOCUMENTS

| | | | |
|---|---|---|---|
| 6,255,848 B1 * | 7/2001 | Schultz et al. | 326/41 |
| 6,262,596 B1 * | 7/2001 | Schultz et al. | 326/41 |
| 7,080,226 B1 * | 7/2006 | Patterson | 711/165 |
| 7,191,342 B1 * | 3/2007 | New et al. | 713/190 |
| 2005/0093572 A1 * | 5/2005 | Sun et al. | 326/38 |

* cited by examiner

*Primary Examiner*—Rexford Barnie
*Assistant Examiner*—Dylan White
(74) *Attorney, Agent, or Firm*—Michael T. Wallace

(57) ABSTRACT

A method and apparatus is provided to implement rapid reconfiguration during either a full, or partial, reconfiguration of a programmable logic device (PLD). Rapid reconfiguration is facilitated by a massively parallel configuration data bus that is created to simultaneously reconfigure the entire height of a reconfiguration memory space. A direct link may be provided to the configuration memory space of the PLD by utilizing interconnect and input/output resources to form the massively parallel configuration data bus. An indirect link may also be provided to the entire configuration memory space by utilizing existing random access memory (RAM) resources within the PLD as configuration bitstream buffers.

16 Claims, 10 Drawing Sheets

APPARATUS AND METHOD FOR RECONFIGURING A PROGRAMMABLE LOGIC DEVICE

FIELD OF THE INVENTION

The present invention generally relates to programmable logic devices (PLDs), and more particularly to PLDs that are adapted for rapid reconfiguration.

BACKGROUND OF THE INVENTION

PLDs are a well-known type of integrated circuit that may be programmed to perform specified logic functions. One type of PLD, the Field Programmable Gate Array (FPGA), typically includes an array of programmable tiles. These programmable tiles can include, for example, Input/Output Blocks (IOBs), Configurable Logic Blocks (CLBs), dedicated Random Access Memory Blocks (BRAM), multipliers, Digital Signal Processing blocks (DSPs), processors, clock managers, Delay Lock Loops (DLLs), Multi-Gigabit Transceivers (MGTs) and so forth.

Each programmable tile typically includes both programmable interconnect and programmable logic. The programmable interconnect typically includes a large number of interconnect lines of varying lengths interconnected by Programmable Interconnect Points (PIPs). The programmable logic implements the logic of a user design using programmable elements that may include, for example, function generators, registers, arithmetic logic, and so forth.

The programmable interconnect and the programmable logic are typically programmed by loading a stream of configuration data into internal configuration memory cells that define how the programmable elements are configured. The configuration data may be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these PLDs, the functionality of the device is controlled by configuration data bits provided to the device for that purpose. The configuration data bits can be stored in volatile memory (e.g., static memory cells, as in FPGAs and some CPLDs), in non-volatile memory (e.g., FLASH memory, as in some CPLDs), or in any other type of memory cell.

Some PLDs, such as the Xilinx Virtex® FPGA, can be programmed to incorporate blocks with pre-designed functionalities, i.e., "cores". A core can include a predetermined set of configuration data bits that program the FPGA to perform one or more functions. Alternatively, a core can include source code or schematics that describe the logic and connectivity of a design. Typical cores can provide, but are not limited to, DSP functions, memories, storage elements, and math functions. Some cores include an optimally floor planned layout targeted to a specific family of FPGAs. Cores can also be parameterizable, i.e., allowing the user to enter parameters to activate or change certain core functionality.

Configuration, and/or full, or partial, reconfiguration of a PLD may be facilitated through dedicated configuration ports, and associated configuration control logic, which are tailored for ease of use, low cost, high flexibility, and backward compatibility. While these configuration ports provide adequate performance during configuration events that are not time critical, they are nevertheless inadequate for configuration events that are time critical.

A conventional configuration event of a PLD is one that is performed on the entire PLD after power-up. A full reconfiguration event, on the other hand, is one that is performed subsequent to a conventional configuration event.

A partial reconfiguration event may be accomplished subsequent to a conventional, or any type of reconfiguration, event, whereby only a portion of the PLD is reconfigured, while other portions of the PLD retain their current configuration. A partial reconfiguration event may also be accomplished dynamically, whereby the other portions of the PLD that retain their current configuration also remain active during reconfiguration of a portion of the PLD.

Each of the reconfiguration events, as discussed above however, are inadequate for time critical applications. For example, dynamic computing applications often require software controlled logic reconfiguration within hundreds of microseconds. Using known configuration techniques, however, the amount of time required for a typical reconfiguration event exceeds the dynamic computing requirements by at least an order of magnitude. That is to say, in other words, that the amount of time required to reconfigure a typical module during a partial reconfiguration event is on the order of several milliseconds, which is inadequate for dynamic computing applications.

One method to decrease the amount of time required for a reconfiguration event is to increase the dedicated configuration port's data width and the dedicated configuration port's data propagation rate. Such a method, however, would likely fail to decrease the amount of reconfiguration time to an acceptable level. Furthermore, such a method would increase the amount of dedicated configuration logic required within the PLD to support the increased configuration port width. Efforts continue, therefore, to obtain significant reduction in the amount of time required to complete a reconfiguration event.

SUMMARY OF THE INVENTION

To overcome limitations in the prior art, and to overcome other limitations that will become apparent upon reading and understanding the present specification, various embodiments of the present invention disclose an apparatus and method for rapid reconfiguration of a programmable logic device.

In accordance with one embodiment of the invention, a programmable logic device comprises a first configuration data router that is coupled to receive a first plurality of configuration data frames. The programmable logic device further comprises a second configuration data router, whereby the second configuration data router is at least partially defined in response to the first plurality of configuration data frames. The programmable logic device further comprises a configuration memory space that is coupled to the second configuration data router and is adapted to receive a second plurality of configuration data frames to define a reconfigurable module within the programmable logic device. The configuration memory space includes a plurality of frame data registers, where each frame data register is adapted to simultaneously receive one configuration data frame of the second plurality of configuration data frames. The configuration memory space further includes a plurality of memory cell frame sets, where each memory cell frame set is coupled to one of the plurality of frame data registers to simultaneously receive one configuration data frame of the second plurality of configuration data frames to define a portion of the reconfigurable module.

In accordance with another embodiment of the invention, a method of reconfiguring a programmable logic device comprises transferring a first plurality of configuration data frames using a first configuration data router to define a second configuration data router. The method further comprises transferring a second plurality of configuration data frames using the second configuration data router to define a reconfigurable module within the programmable logic device. The method further comprises simultaneously applying a portion of configuration data frames of the second plurality of configuration data frames to respective memory cell frames of a plurality of memory cell frame sets, where the reconfigurable module is defined by the second plurality of configuration data frames stored within the plurality of memory cell frame sets.

In accordance with another embodiment of the invention, an integrated circuit comprises a configuration data router that is coupled to receive a plurality of configuration data frames. The configuration data router includes an interconnect bus that is adapted to provide the plurality of configuration data frames to define a reconfigurable module within the integrated circuit. The configuration data router further includes a plurality of frame data registers that are coupled to the interconnect bus, where each frame data register is coupled to receive a configuration data frame of the plurality of configuration data frames and is adapted to apply the configuration data frame to a respective memory cell frame set to simultaneously define one memory cell frame in each memory cell frame set, where the reconfigurable module is defined by the plurality of configuration data frames stored within the memory cell frame sets.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
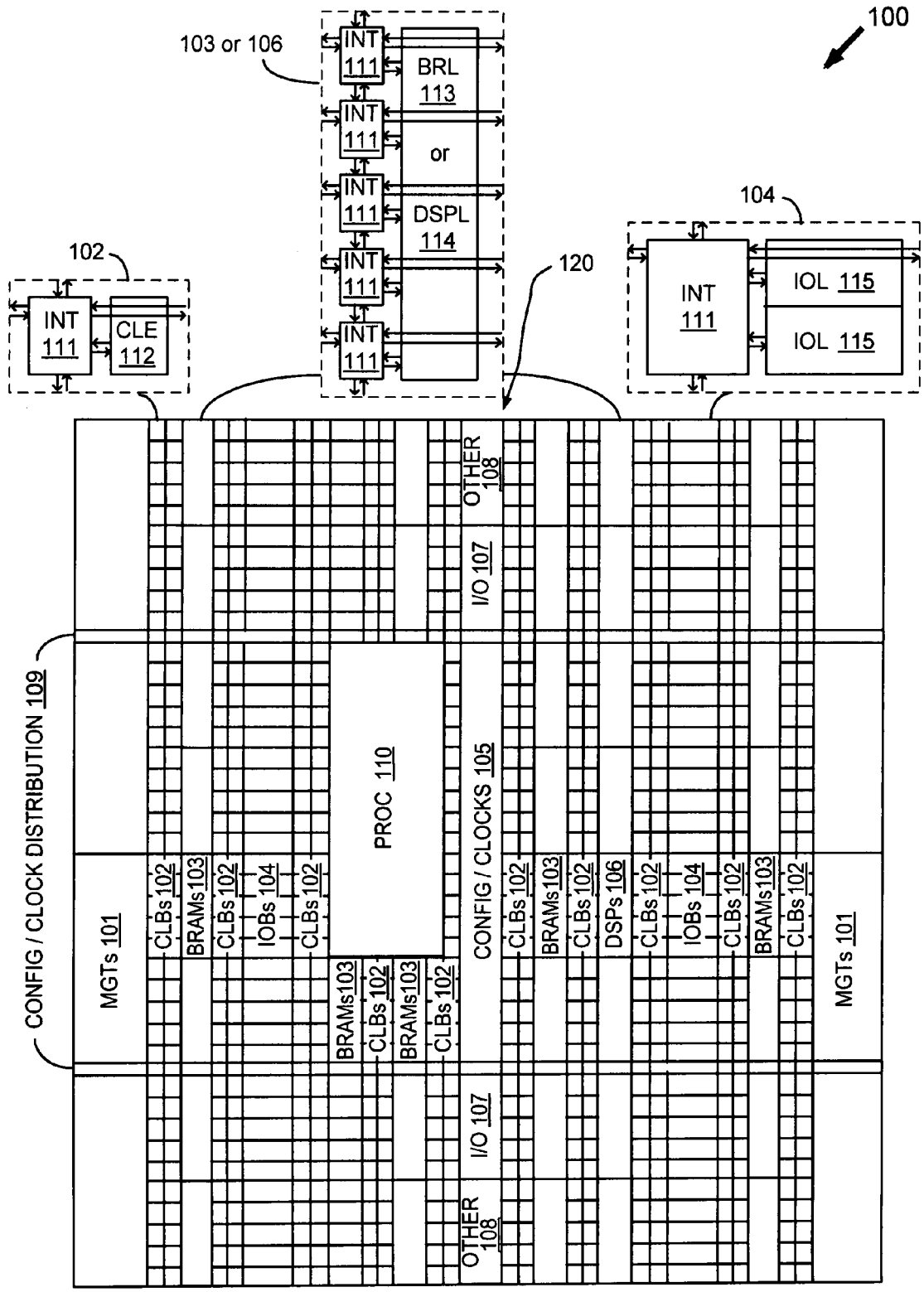
FIG. 1 illustrates an exemplary Field Programmable Gate Array (FPGA) architecture.

Generally, various embodiments of the present invention are applied to the field of integrated circuits (ICs) of which programmable logic devices (PLDs) are a subset. In particular, a method and apparatus is provided to significantly decrease the amount of time required to reconfigure a PLD during a full, or partial, reconfiguration event.

In one embodiment of the present invention, a direct link is provided to the configuration memory space by utilizing interconnect and logic resources to form a massively parallel configuration data bus that bypasses the conventional configuration controller. In a second embodiment, an indirect link is provided to the configuration memory space by utilizing random access memory (RAM) resources within the PLD as configuration bitstream buffers. In either embodiment, a massively parallel configuration data bus is created to simultaneously transfer multiple configuration data frames to reconfigure multiple configuration frame sets within the configuration memory space as discussed in more detail below.

One embodiment utilizes fabric resources that are programmed to function as configuration controllers, and therefore, are to remain programmed, i.e., static, throughout each reconfiguration event. During a partial reconfiguration event, the configuration controller is necessarily static, given that the partial reconfiguration region does not include resources that implement the configuration controller.

During a full reconfiguration event, on the other hand, the configuration controller is necessarily reprogrammed. Nevertheless, it remains necessary that the configuration controller remain active during the full reconfiguration event, even while being reprogrammed. Maintaining the configuration controller in an active state during a reconfiguration event may be accomplished in various ways. In a first embodiment, for example, the configuration data bits of the full reconfiguration event may be verified to reconfigure the configuration controller into an implementation that exactly matches the previous implementation of the configuration controller that existed prior to the full reconfiguration event. In such an instance, the configuration controller is effectively unchanged and virtually active throughout the full reconfiguration event.

In an alternate embodiment, each memory cell frame may be implemented as a master memory cell frame combined with a slave memory cell frame. In such an instance, the master memory cell frames may first be configured to implement the configuration controller. The full reconfiguration event may then reprogram all slave memory cell frames with the configuration data that is to be used to reconfigure the reconfiguration region. A global signal may then be asserted to transfer the configuration data from the slave memory cell frames to the master memory cell frames, which causes a reconfiguration of the configurable interconnect and logic resources of the reconfiguration region to occur at the end of the full reconfiguration event.

As noted above, advanced FPGAs can include several different types of programmable logic blocks in the array. For example, FIG. 1 illustrates an FPGA architecture 100 that includes a large number of different programmable tiles including multigigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 typically are not confined to the area of the input/output logic element 115.

In the pictured embodiment, a columnar area near the center of the die (120 in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs are typically included wherever the CLBs appear, to facilitate the efficient implementation of user logic, but the number of adjacent CLB columns varies with the overall size of the FPGA.

Figure 2:
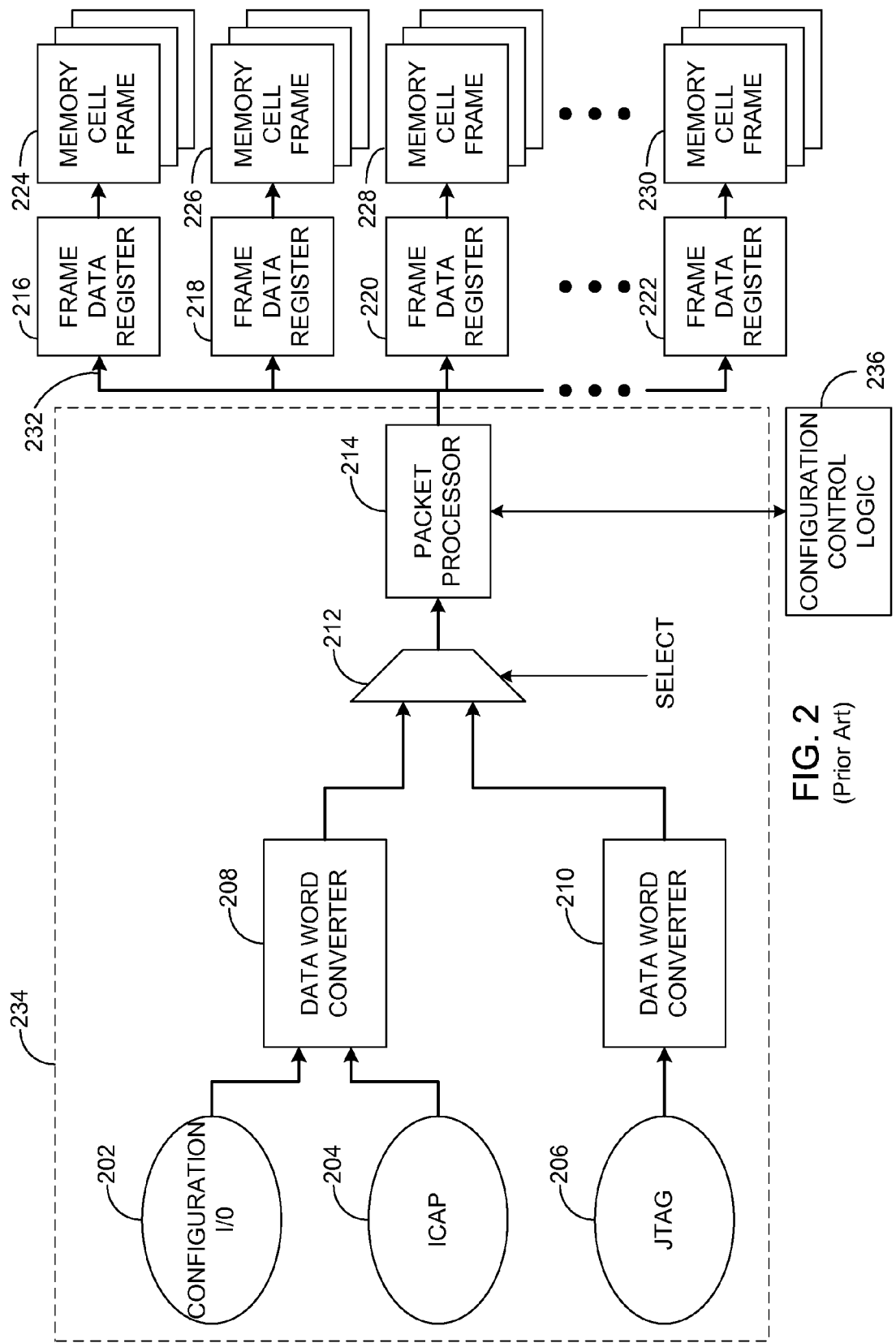
FIG. 2 illustrates an exemplary embodiment of a conventional programmable logic device (PLD) configuration controller.

Turning to FIG. 2, a dedicated PLD configuration controller is exemplified, whereby configuration data router 234 facilitates the propagation of configuration data into the configuration memory space that is comprised of frame data registers 216-222 and memory cell frame sets 224-230 of a PLD, such as FPGA 100. Configuration data router 234 is comprised of configuration interfaces 202-206, data word converters 208-210, multiplexer 212, and packet processor 214. To program the configuration memory space, instructions for configuration control logic 236 and data for the configuration memory space are provided in the form of a configuration bitstream, which is delivered to configuration control logic 236 and configuration memory space via configuration data router 234.

Configuration memory is arranged in multiple sets of memory cell frames that are tiled about FPGA 100, whereby each memory cell frame set represents an entire row of configuration memory cells. For example, the first memory cell frame of memory cell frame set 224 configures the first column of the first row of configuration memory cells within the configuration memory space, the second memory cell frame of memory cell set 224 configures the second column of the first row of configuration memory cells within the configuration memory space, and so on. Memory cell frame sets 226-230 are similarly arranged, such that memory cell frame set 226 configures the multiplicity of columns contained within the second row of the configuration memory space, memory cell frame set 228 configures the multiplicity of columns contained within the third row of the configuration memory space, and memory cell frame set 230 ultimately configures the multiplicity of columns contained within the last row of the configuration memory space.

The height of each frame of memory cells is determined by the particular generation of PLD. Earlier FPGAs, for example, require the height of the configuration memory cell frames to be equal to the height of the device itself. More recent FPGA generations, however, divide the height of the device into two or more rows, whereby each configuration memory cell frame is mapped into a configuration memory cell column and a configuration memory cell row as discussed above. In such an instance, a single frame of configuration data is addressed to a particular column and row within the configuration memory space, whereby each single frame of configuration data is comprised of, for example, 41, 32-bit data words for a total of 1312 bits per configuration memory frame. It is understood, however, that configuration memory frame sizes are device dependent and may be adapted to be any size as may be required by the particular device being configured.

Each configuration memory cell frame is the smallest addressable segment of the configuration memory space. Therefore, all configuration operations are required to act upon whole configuration memory cell frames. Furthermore, each configuration memory cell frame is mapped into a portion of configurable logic that is bounded by a configuration memory cell column and a configuration memory cell row as discussed above. As such, configuration of an FPGA using the dedicated configuration controller of FIG. 2 is necessarily accomplished sequentially, whereby the configuration bitstream delivered by configuration data router 234 is addressable to only one of configuration memory cell frame sets 224-230 at a time.

Configuration I/O 202, for example, may be configured to transfer the configuration bitstream either serially, or in configurable data widths of, e.g., 8, 16, or 32 bits. In particular, configuration I/O 202 may include a serial configuration programmable read only memory (PROM) that stores the configuration data and then transfers the configuration data to FPGA 100 in response to a configuration clock signal. In a serial transfer mode, a single configuration bit may be transferred for each configuration clock cycle. Conversely, a parallel transfer mode may be used to transfer the configuration data in multiple bit data words, e.g., 8, 16, or 32-bit data words, for each configuration clock cycle.

Data word converter 208 then receives the configuration data from configuration I/O 202 and converts the configuration data into a pre-determined word width of, for example, 32 bits, where the pre-determined word width is selected to be compatible with multiplexer 212, packet processor 214, and frame data registers 216 -22. Packet processor 214 then sequentially transfers a frame of configuration data words, e.g., 41, 32-bit configuration data words, to one of frame data registers 216-222 that is addressed by configuration control logic 236, where the addressed frame data register corresponds to the row of the configuration memory space that is being reconfigured. The addressed frame data register then transfers the configuration data frame to the memory cell frame that is addressed by configuration control logic 236, where the addressed memory cell frame corresponds to the particular column of the particular row of the configuration memory space that is being reconfigured. Once written, the configuration data frame may then be verified by reversing the sequence of configuration data transfers.

As discussed above, instructions for configuration control logic 236 and data for the configuration memory space are provided in the form of a configuration bitstream, which is delivered to FPGA 100 via configuration data router 234. Internal configuration access port (ICAP) 204 provides an alternate configuration interface, which is internal to FPGA 100. ICAP 204, therefore, obviates the need to use an external configuration interface as discussed above in relation to configuration I/O 202. Instead, ICAP 204 represents an internally accessed resource containing configuration data, which is then processed into configuration data frames as discussed above.

Joint test action group (JTAG) interface 206 supports configuration of FPGA 100 via the IEEE 1532 standard for in-system configuration (ISC), based on the IEEE 1149.1 standard. JTAG interface 206 provides a single pin that provides the serial input to all JTAG and instruction registers (not shown) in response to the JTAG test clock signal. An instruction register (not shown) is then used to receive an operational code that configures JTAG interface 206 for an ISC operation, whereby the serial input provided by JTAG interface 206 provides the configuration bitstream to data word converter 210. The serial configuration bitstream is then converted to, e.g., 32-bit words, via data word converter 210, similarly as discussed above in relation to data word converter 208. The configuration data words are then provided to packet processor 214 via multiplexer 212 for sequential distribution to frame data registers 216-222 and memory cell frames 224-230 as discussed above.

Configuration data router 234 of FIG. 2, however, necessarily requires an extended amount of time for a typical reconfiguration event for several reasons. First, the maximum configuration data width is limited to, e.g., 32 bits, by configuration interfaces 202 and 204. That is to say, for example, that in order to transfer a single configuration data frame consisting of 41, 32-bit data words to memory cell frame sets 224-230, 41 clock cycles are required. The configuration data width may be further limited to a maximum of 1 bit by configuration interface 206, which requires, for example, 32*41=1312 clock cycles to transfer a single configuration data frame.

Second, the configuration bitstream for each of configuration interfaces 202-206 is addressable to only one of configuration memory cell frame sets 224-230 at a time. Thus, each configuration memory cell frame set 224-230 may only be accessed sequentially by packet processor 214, which further increases the amount of time required for a typical reconfiguration event. Third, the transfer rate provided by configuration interfaces 202-206 is typically limited to a data rate that is much lower than the data rates attainable in other portions of the PLD, such as within INTs 111, lOBs 104, and MGTs 101 of FIG. 1.

Figure 3A:
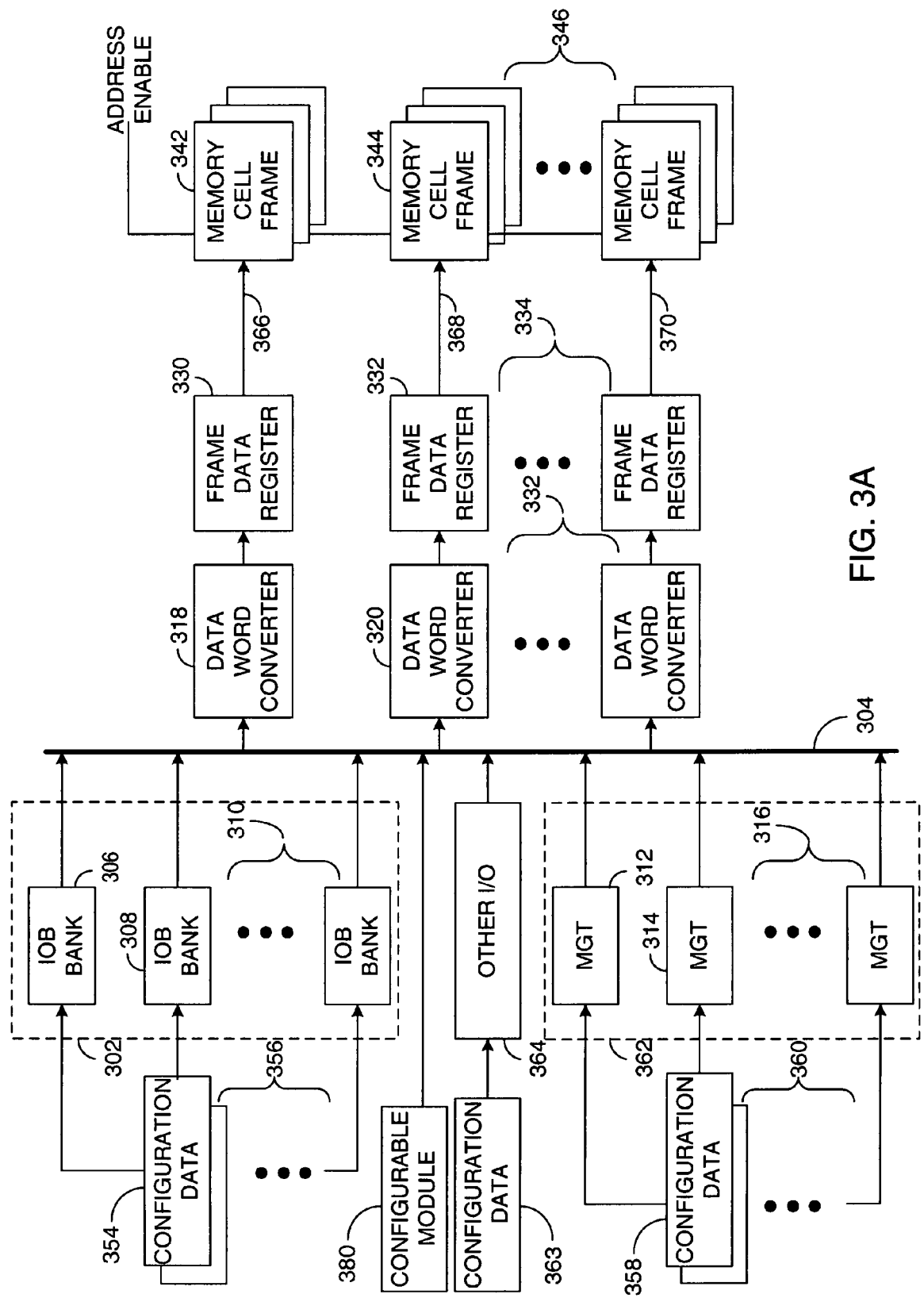
FIG. 3A illustrates an alternate embodiment of an exemplary PLD configuration controller.

Turning to FIG. 3A, an alternate embodiment of an exemplary configuration controller is illustrated, whereby the time required to execute a reconfiguration event is significantly decreased as compared to the amount of time required to execute a reconfiguration event using the dedicated configuration controller of FIG. 2. In particular, the configuration controller of FIG. 3A facilitates the simultaneous transmission of the configuration data via a massively parallel configuration data router spanning multiple memory cell frame sets within the configuration memory space. Furthermore, the configuration controller of FIG. 3A facilitates a higher transfer rate of configuration data as compared to the dedicated configuration controller of FIG. 2 because high-speed I/O circuitry and interconnect within the programmable fabric of FPGA 100 is utilized as a configuration data router to transfer configuration data to the configuration memory space instead of the comparably lower transfer rates as facilitated by configuration data router 234 of FIG. 2.

In particular, various I/O, interconnect, logic and/or RAM resources within the configurable logic fabric of FPGA 100 may be utilized as a parallel configuration data router to transfer configuration data to configuration memory cell frame sets 342-346, as opposed to utilizing the configuration data router 234 of FIG. 2. As such, configuration data router 234 of FIG. 2 is bypassed, such that the configuration data may instead be transferred in a massively parallel fashion to significantly decrease the amount of time that is required to implement either a full reconfiguration, or a partial reconfiguration, of a PLD such as FPGA 100 of FIG. 1.

Figure 3B:
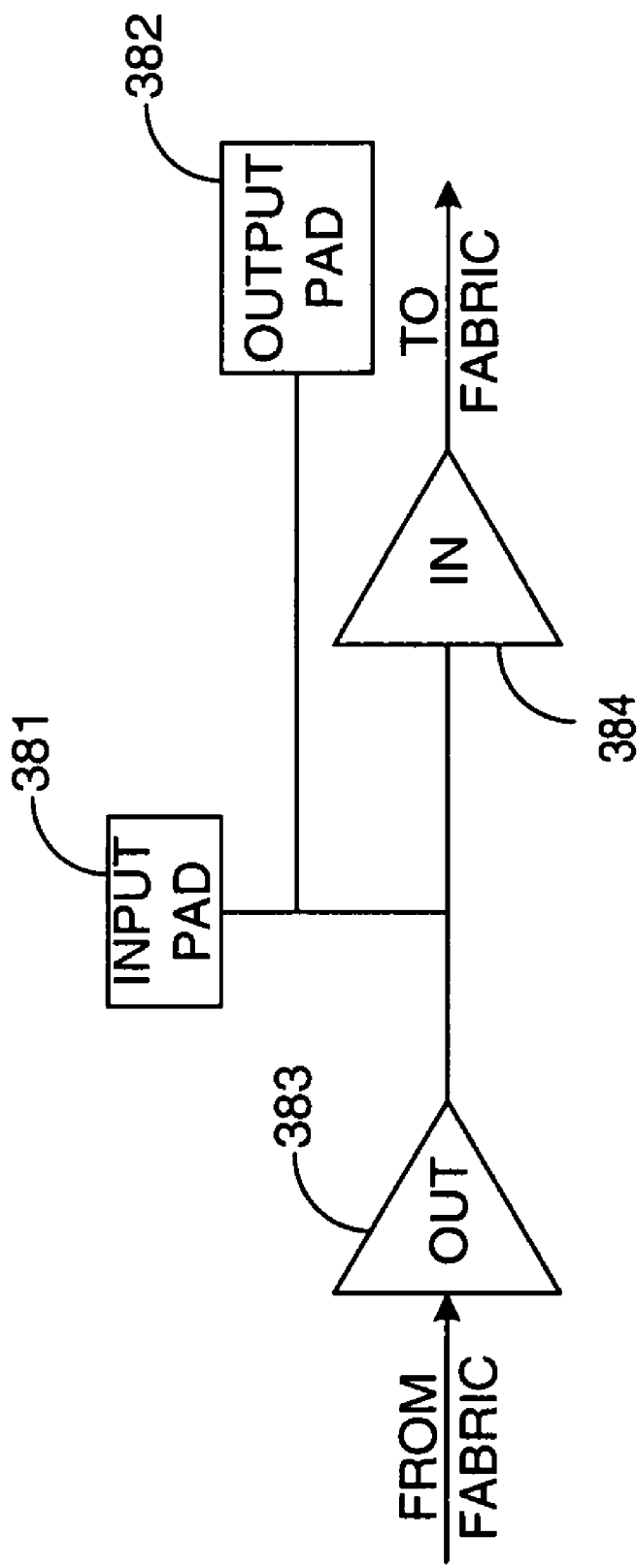
FIG. 3B illustrates an exemplary schematic diagram of the input/output logic elements of FIG. 3A.

In a first embodiment, banks of lOBs 306-310 may be utilized to form logic module 302 to receive configuration data from configuration data blocks 354-356. Each IOB bank 306-310 contains a configurable number of input/output logic IOL 115 elements, as exemplified in FIG. 3B, that provide input buffer 384, and associated input pad 381, as well as output buffer 383, and associated output pad 382. Each configuration data bit received from configuration data blocks 354-356 may be received at input pad 381 and then amplified by input buffer 384 before being delivered to the PLD fabric. Input buffer 384 supports a wide variety of standard interfaces by offering a robust, programmable feature set including programmable output signal amplitude, slew rate, and input termination impedance to name just a few.

Configuration data blocks 354-360 may be stored in non-volatile memory (e.g. in an external PROM or FLASH memory), or may also be transmitted by a separate system, such as a microprocessor based transmission system, and received through a standard interface block, such as PCI Express (PCIe) or Ethernet Media Access Controller (EMAC) (not shown in FIG. 1), or through any other block designed and/or programmed to receive configuration data. In one embodiment, configuration data blocks 354-360 may represent an entire configuration definition that may be used to implement user logic, connectivity, and I/O definitions for an entire PLD.

In an alternate embodiment, configuration data block 354, in combination with configuration data blocks 356, may represent two or more definitions of one or more functional blocks that may be dynamically reconfigured while other portions of the PLD remain operational. In particular, memory cell frame sets 342-346 may represent the configuration memory space of a dynamically reconfigurable functional block for any number of dynamic computing applications.

For example, configuration data block 354 may represent a first configurable logic definition that when downloaded into memory cell frame sets 342-346, configures a reconfigurable module within the PLD into a first decryption circuit that is optimized for a first decryption algorithm. Similarly, configuration data blocks 356 may represent a multiplicity of other configurable logic definitions that when loaded into memory cell frame sets 342-346, reconfigures the reconfigurable module within the PLD into a multiplicity of decryption circuits that are optimized for a multiplicity of decryption algorithms. As such, a dynamic computing application may be facilitated, whereby hardware within the PLD is software configurable to optimize performance depending upon the particular encryption algorithm utilized.

The configuration controller of FIG. 3A implements a massively parallel configuration data router, which bypasses configuration data router 234 of FIG. 2, to facilitate direct access to the configuration memory space that is comprised of frame data registers 330-334 and memory cell frame sets 342-346. In one embodiment, the configuration data router of FIG. 3A is comprised of logic module 302, interconnect 304, and data word converters 318-322. As such, the configuration data router of FIG. 3A significantly decreases the amount of time required for a full reconfiguration, or partial reconfiguration, of the PLD for several reasons.

At least one of IOB banks 306-310 of logic module 302, for example, may facilitate a parallel configuration data bus that connects to interconnect bus 304, which then distributes the configuration data to data word converters 318-322, where data word converters 318-322 may be implemented using logic and/or RAM resources within the FPGA fabric. In one embodiment, the communication bus between data word converters 318-322 and associated frame data registers 330-334 is wider than 32 bits, e.g., 160 bits, and thus transfers a full configuration data frame in fewer clock cycles as compared to configuration data router 234 of FIG. 2. Furthermore, frame data registers 330-334 are adapted to receive their respective configuration data frames at the same time from data word converters 318-322.

It can be seen, therefore, that while configuration data router 234 of FIG. 2 transfers a single configuration data frame in, e.g., 41 clock cycles, the configuration data router of FIG. 3A may instead simultaneously transfer multiple configuration data frames in the same, or fewer, number of clock cycles. The number of configuration data frames that may be simultaneously transferred depends upon the size of the configuration data router that is implemented, as well as the number of frame data registers that exist within the configuration memory space.

Furthermore, the configuration data router of FIG. 3A increases the rate at which configuration data is transferred to the configuration memory space. As illustrated, for example, IOB banks 306-310 of logic module 302 within the configurable logic fabric are utilized to transfer the configuration bitstreams from configuration data blocks 354-356. Since the transfer rate of IOBs 104 within the PLD fabric typically exceeds the transfer rate attainable within configuration data router 234 of FIG. 2, the amount of time required to implement a full, or partial, reconfiguration when utilizing the configuration data router of FIG. 3A is significantly decreased.

Figure 3C:
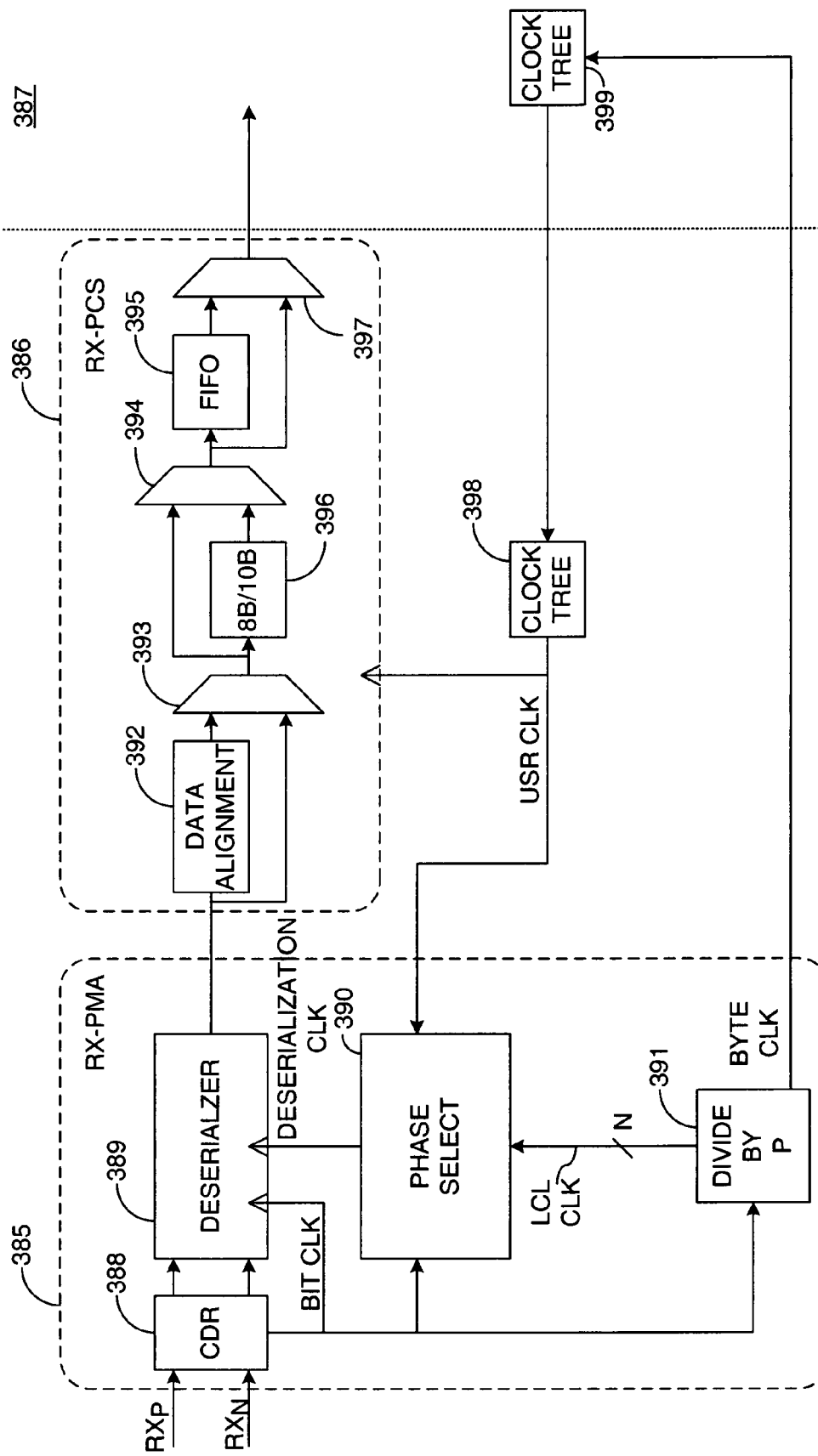
FIG. 3C illustrates an exemplary block diagram of the receive portion of the multigigabit transceivers of FIG. 3A.

Turning to FIG. 3C, an alternate embodiment is exemplified, in which high speed transceivers, such as multigigabit transceivers (MGTs) 312-316 of logic block 362, are utilized to transfer the configuration bitstreams from configuration data blocks 358-360. FIG. 3C highlights some of the features of the receive-physical media attachment (RX-PMA) 385 and receive-physical coding sublayer (RX-PCS) 386 of MGTs 312-316. Clock and data recovery (CDR) block 388 extracts the clock rate, i.e., signal BIT CLK, and data information from the differential configuration data received at the $RX_P$ and $RX_N$ input terminals. Deserializer 389 aligns the configuration data bits into data words of variable width, e.g., 32-bits or 40-bits, in accordance with signals BIT CLK and DESERIALIZATION CLK.

Signal BIT CLK is also provided to divide by P 391, whereby signal BIT CLK is divided into a clock signal, e.g., signal BYTE CLK, that operates at a frequency equal to BIT CLK/P. Divide by P 391 then drives the root of balanced clock tree 399 with signal BYTE CLK for distribution to PLD fabric 387 as well as to balanced clock tree 398. The output of balanced clock tree 398, i.e., signal USR CLK, is then distributed to RX-PCS 386 and RX-PMA 385.

Phase select 390 seeks to maintain phase coherency between clock signals USR CLK and DESERIALIZATION CLK by selecting one of phase variants LCL $CLK_N$ from divide by P 391 that is either closest in phase to signal USR CLK, or that has some other fixed, favorable phase relationship with respect to signal USR CLK. Once phase select 390 has selected the proper phase variant from divide by P 391, phase select 390 then provides the proper phase variant as signal DESERIALIZATION CLK to deserializer 389.

By achieving the optimized phase relationship between signals USR CLK and DESERIALIZATION CLK, phase select 390 guarantees a proper timing relationship between the clock domains of RX-PMA 385 and RX-PCS 386. As such, reliable data transfer between RX-PMA 385 and RX-PCS 386 is guaranteed, since the phase difference relative to signals USR CLK and DESERIALIZATION CLK is a known value.

Bit alignment, otherwise known as comma detection, within each configuration data word may be implemented via data alignment block 392. In this instance, data alignment block 392 is not bypassed and is instead inserted into the configuration data path by appropriate input selection of multiplexer 393, so that the bit position of each bit of a configuration data word generated by deserializer 389 may be rotated by a barrel shifter (not shown) within data alignment block 392.

The configuration bitstream may also be encoded using, for example, an 8B/10B line code, whereby a DC balance is guaranteed in order to enhance clock and data recovery at CDR block 388 when AC coupling is utilized at input terminals $RX_P$ and $RX_N$. If 8B/10B encoding is not utilized, 8B/10B decoding block 396 may be bypassed using appropriate select logic for multiplexer 394. FIFO 395 may also be bypassed during a low latency mode of operation by appropriate select logic for multiplexer 397.

It can be seen, therefore, that massively parallel configuration data streams operating at gigabit transfer rates may be achievable to further decrease the amount of time required to implement a full, or partial, reconfiguration. The number of configuration data frames that may be simultaneously transferred depends upon the size of the configuration data router that is implemented, where in an alternate embodiment, the configuration data router of FIG. 3A may be comprised of MGTs 312-316 of logic module 362, interconnect bus 304, data word converters 318-322, and the associated configuration memory space that is comprised of frame data registers 330-334 and memory cell frame sets 342-346. It is understood that MGTs 312-316 may also be adapted to facilitate communication using a variety of communication protocols, such as PCIe, Gigabit Ethernet, etc.

In other embodiments, the configuration bitstreams may be transferred to interconnect bus 304 using other I/O 364, which may represent any other input/output device that is capable of transferring configuration data. For example, wireless and/or optical transceivers may be employed as other I/O 364. Alternately, other I/O 364 may represent interface buffers that are implemented on multiple die that are stacked within the same package.

In other embodiments, configuration data may already be stored within the PLD, such as FPGA 100 of FIG. 1, thus obviating the need to use logic blocks 302, 362, and/or 364 to receive configuration bitstreams that are transmitted to FPGA 100 from an external source. In particular, configuration bitstreams may instead originate from configurable module 380 that is implemented within FPGA 100, where configurable module 380 may be implemented using CLBs 102, DSPs 106, PROC 110 and/or any other programmable tile that may be implemented within FPGA 100.

Whether internal, or external, means are used to effect the transfer of configuration bitstreams to the configuration memory space, interconnect bus 304 and data word converters 318-322 are utilized. In particular, interconnect bus 304 may be implemented via INTs 111, as discussed above in relation to FIG. 1, so that a direct connection between logic modules 302, 362-364 and data word converters 318-322 may be facilitated.

Figure 4:
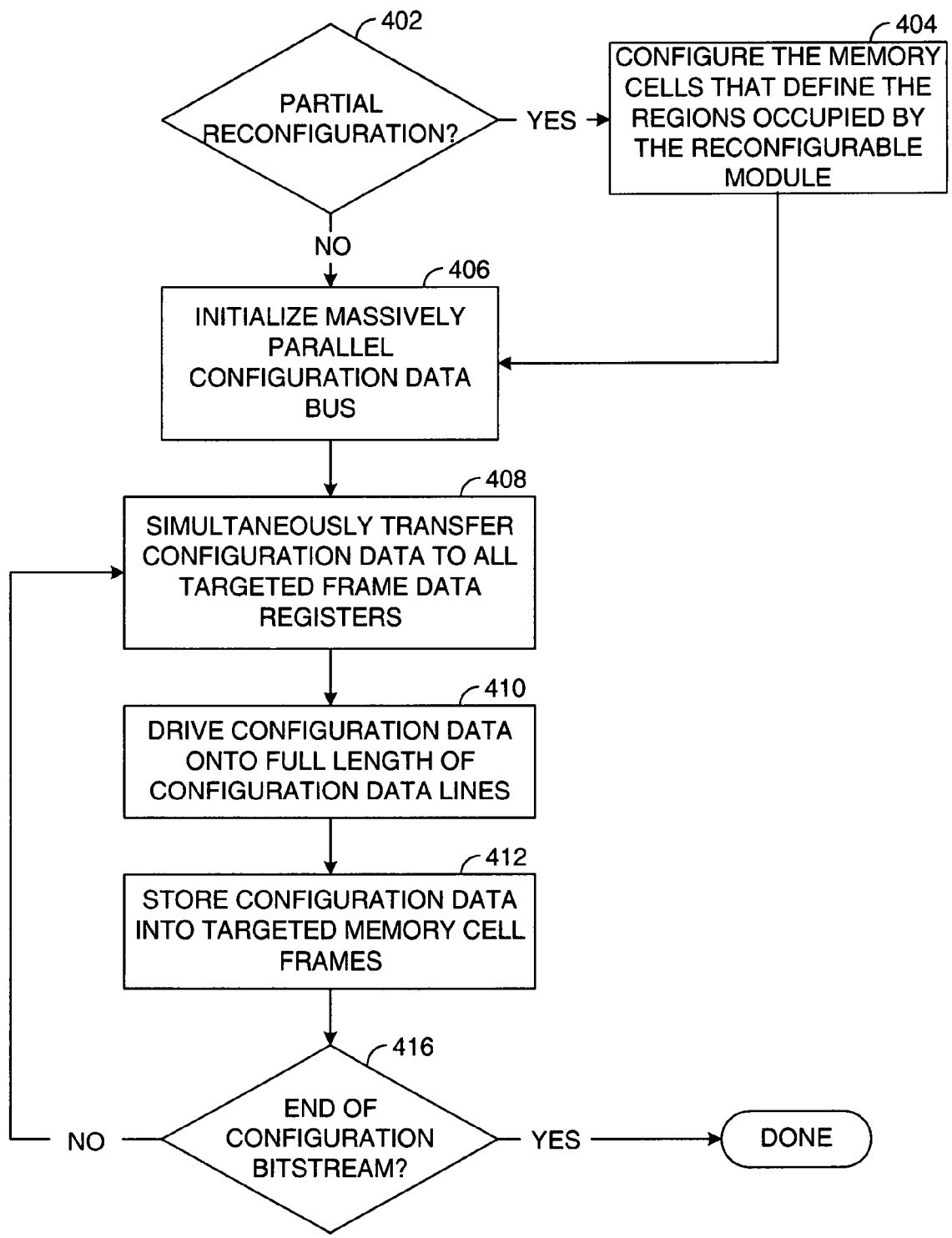
FIG. 4 illustrates an exemplary flow diagram of a method to perform full, or partial, reconfiguration using the configuration controller of FIG. 3A.

Turning to FIG. 4, an exemplary flow diagram of an implementation method is illustrated, whereby the configuration data router of FIG. 3A may be used for full, or partial, reconfiguration of a module within a particular PLD, e.g., FPGA 100 of FIG. 1. It is noted, that the configuration data router of FIG. 3A is generally configured after power-up through a standard configuration process that uses a dedicated configuration controller, such as the conventional configuration controller as exemplified in FIG. 2. Frame data registers 330-334 form a "backbone" within FPGA 100 along columnar areas 105, 107, and 108 near the center of FPGA 100 (shown shaded 120 in FIG. 1). Configuration data may, therefore, be disseminated across the full breadth of FPGA 100, either to the left or the right of columnar areas 105, 107 and 108, wherever memory cell frame sets 342-346 of the configuration memory space are located. Thus, rather than limit configuration data distribution to only one frame data register at a time, as discussed above in relation to configuration data router 234 of FIG. 2, each of frame data registers 330-334 in the configuration memory space instead facilitates the transfer of a full configuration data frame to respective memory frame cell sets 342-346 at the same time, as discussed above in relation to the configuration data router of FIG. 3A.

In step 402, a determination is made as to whether any of memory cell frame sets 342-346 define configurable logic modules that are meant to be reconfigured during a partial reconfiguration event while other portions of the PLD remain configured and operational. In other words, step 402 determines whether any of memory cell frame sets 342-346 define reconfigurable logic modules. In certain applications, such as dynamic computing applications, for example, reconfigurable logic modules are utilized, since the reconfigurable logic modules facilitate the loading of different designs while the fixed logic modules remain operational. The configuration data router of FIG. 3A, which consists of logic modules 302, 362, 304, and 318-322, for example, may be considered fixed logic modules, since the interconnect relationship between configuration data blocks 354-360 and frame data registers 330-334 is to remain fixed.

If some, or all, of memory cell frame sets 342-346 define reconfigurable logic module(s), then certain parameters of those reconfigurable logic modules are defined in step 404. In particular, the reconfigurable modules' dimensions and position, as defined by the number of configuration rows and configuration columns, are to be programmed within the FPGA. Defining the reconfigurable modules' dimensions and position facilitates the determination as to which parts of the FPGA are to remain operational during a reconfiguration event, and which parts of the FPGA are to be disabled and subsequently reconfigured.

In step 406, the configuration data router of FIG. 3A may be initialized for full, or partial, reconfiguration, where the initialization may be accomplished in a relatively short amount of time using the dedicated configuration controller of FIG. 2 without any significant speed penalty. As such, the configuration data router of FIG. 3A may be optimized for a higher transfer rate of configuration data, as compared to transfer rate of configuration data that is provided by configuration data router 234 of FIG. 2. The initialization of step 406 performs tasks such as, selecting which of frame data registers 330-334 are targeted, determining the column address of the first configuration data frame to be reconfigured, and setting the total number of column addresses that are to be reconfigured. A command may then be sent to configuration control logic (not shown in FIG. 3A) to start the actual configuration data transfer using the configuration data router of FIG. 3A, rather than configuration data router 234 of FIG. 2, thereby bypassing configuration data router 234 during configuration steps 408-416.

Steps 408-416 form a continuous process loop that is repeated until the end of the configuration bitstream, which is to say that steps 408-416 are repeated until the entire targeted configuration memory space has been reconfigured as determined in step 416. In step 408, one or more configuration data frames are transferred using the configuration data router of FIG. 3A, depending upon the number of frame data registers 330-334 that are targeted. In step 410, the targeted frame data registers 330-334 simultaneously latch the values of the received configuration data frames and drive each configuration data bit of each configuration data frame onto the full length of configuration datalines 366-370.

In step 412, all rows of the configuration memory space are simultaneously configured, once the address line of each targeted memory cell frame is asserted via the ADDRESS ENABLE control bus. Since the configuration data frames are latched in step 408, steps 408-412 may be performed simultaneously on different configuration data frames. In particular, while a set of configuration data frames are being driven onto configuration datalines 366-370 as in step 410 and subsequently stored within memory cell frame sets 342-346 as in step 412, the next set of configuration data frames may be transferred to the targeted frame data registers as in step 408. As such, the amount of time required to complete one iteration of the loop in FIG. 4 is reduced.

Figure 5:
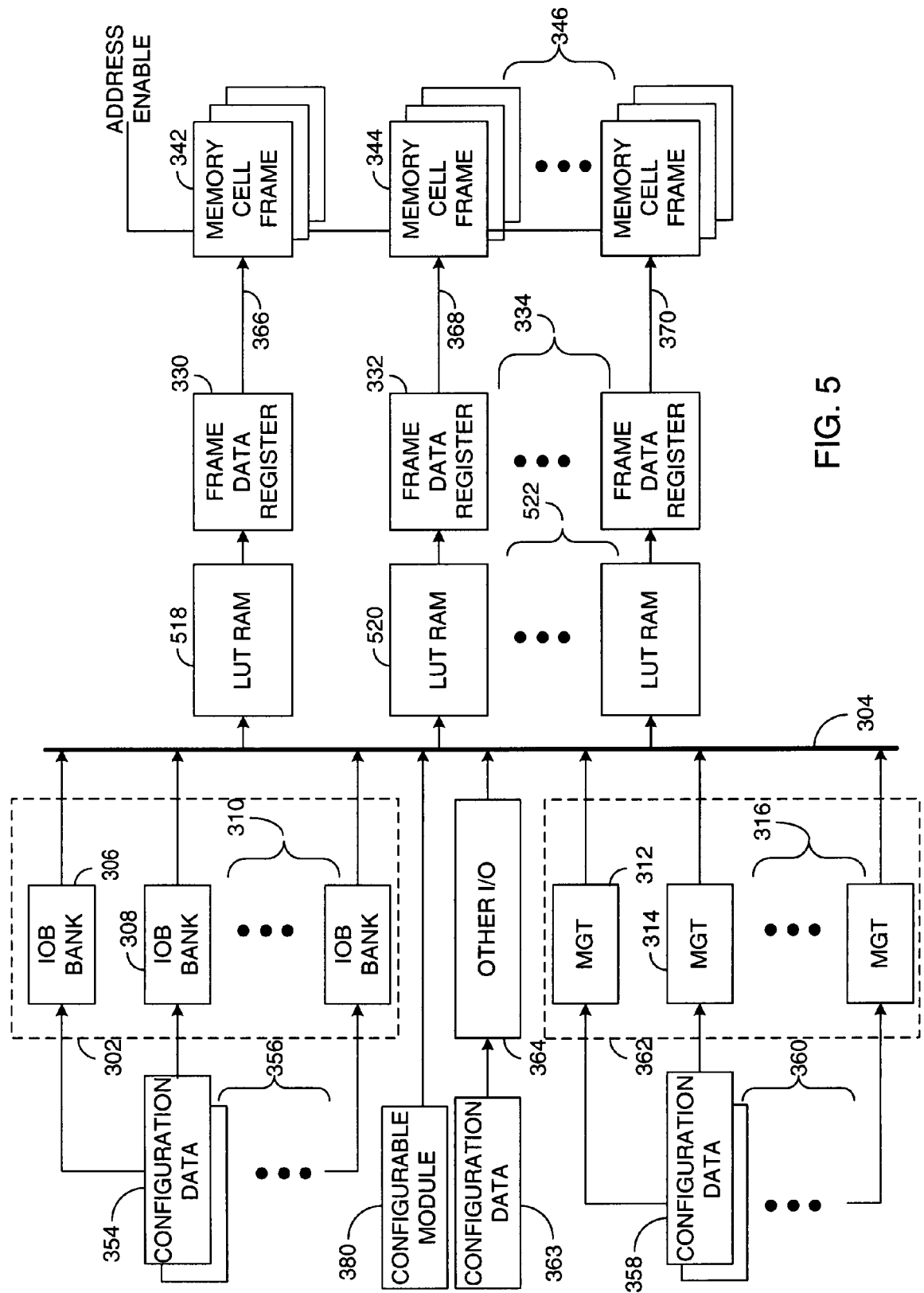
FIG. 5 illustrates an alternate embodiment of an exemplary PLD configuration controller.

Turning to FIG. 5, an alternate embodiment of a configuration controller is exemplified. In particular, instead of using a direct connection to frame data registers 330-334 via data word converters 318-322 as discussed above in relation to FIG. 3A, an indirect connection is facilitated through the use of look-up-table (LUT) resources that are configured as random access memories (RAMs) within the PLD fabric.

While LUT RAMs 518-522 provide a reduced configuration data transfer rate as compared to the configuration controller of FIG. 3A, LUT RAMs 518-522 nevertheless provide an added advantage. In particular, LUT RAMs 518-522 already exist within the configurable logic fabric of FPGA 100, thus by utilizing LUT RAMs 518-522 as an indirect link to the configuration memory space, the need to commit further resources for the implementation of data word converters 318-322 and their respective direct connections to frame data registers 330-334 of FIG. 3A is obviated. In addition, LUT RAMs 518-522 are configured along the entire height of the configuration memory space to provide a massively parallel configuration data bus that may be used to simultaneously configure targeted frame data registers 330-334 and memory cell frame sets 342-346.

Figure 6:
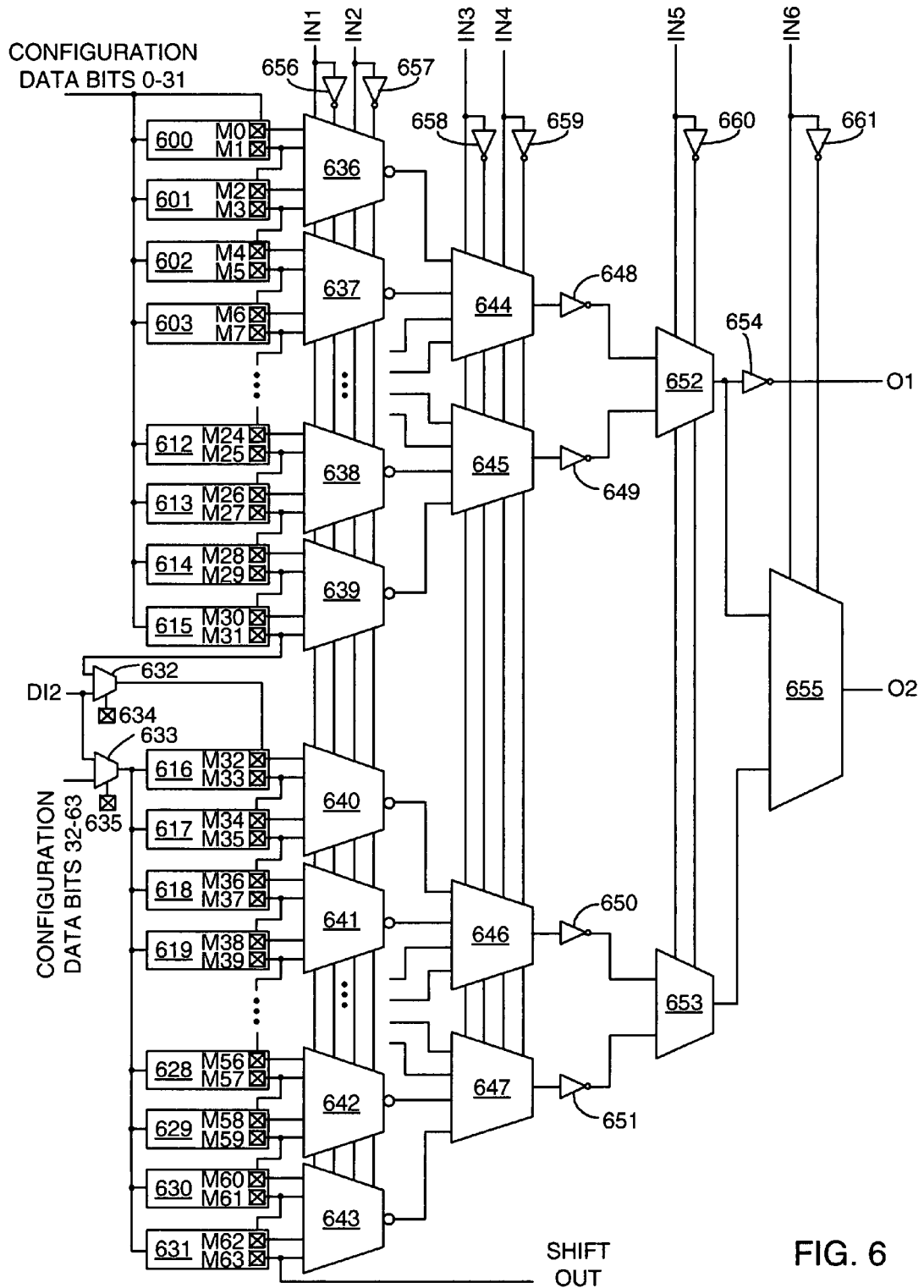
FIG. 6 illustrates an exemplary block diagram of the look-up-table random access memory resources of FIG. 5.

Turning to FIG. 6, a block diagram of an exemplary LUT RAM, as utilized in the configuration controller of FIG. 5, is illustrated. Memory circuits 600-631 each provide two memory cells that store the RAM values, which in one embodiment, are configuration data bits 0-63 as provided by configuration data blocks 354-360. It is understood, however, that the number of memory circuits utilized at the input to a LUT RAM is configurable, so that the width of the configuration data bus may be adapted to less than 64 bits as required. Furthermore, additional memory circuits may be added to the input a LUT RAM so as to increase the width of the configuration data bus beyond 64 bits.

Since a LUT RAM may be configured as both a shift register and/or a RAM device, multiplexers 632, 633 are provided and controlled by memory cells 634, 635 to select shift data and/or RAM input data. Memory circuits 600-631 drive 4-to-1 multiplexers 636-643, which are controlled by control signals IN1, IN2 and their inverted counterparts (provided by inverters 656, 657) to select 16 of the signals from the configuration memory cells of memory circuits 600-631. The selected 16 signals drive four 4-to-1 multiplexers 644-647, which are controlled by control signals IN3, IN4 and their inverted counterparts (provided by inverters 658, 659) to select four of the signals to drive inverters 648-651. Inverters 648-651 drive 2-to-1 multiplexers 652-653, which are controlled by control signal IN5 and its inverted counterpart (provided by inverter 660). The output of multiplexer 652 is inverted by inverter 654 and provides output signal O1. Thus, output signal O1 can provide any function of up to five control signals, IN1-IN5. Inverters can be inserted wherever desired in the multiplexer structure, with an additional inversion being nullified by simply storing inverted data in the configuration memory cells M0-M63 of memory circuits 600-631.

Multiplexers 652 and 653 both drive data input terminals of multiplexer 655, which is controlled by control signal IN6 and its inverted counterpart (provided by inverter 661) to select either of the two signals from multiplexers 652-653 to drive output terminal O2. Thus, output signal O2 can either provide any function of up to five control signals IN1-IN5 (when multiplexer 655 selects the output of multiplexer 652, i.e., when control signal IN6 is high), or any function of up to six control signals IN1-IN6.

Figure 7:
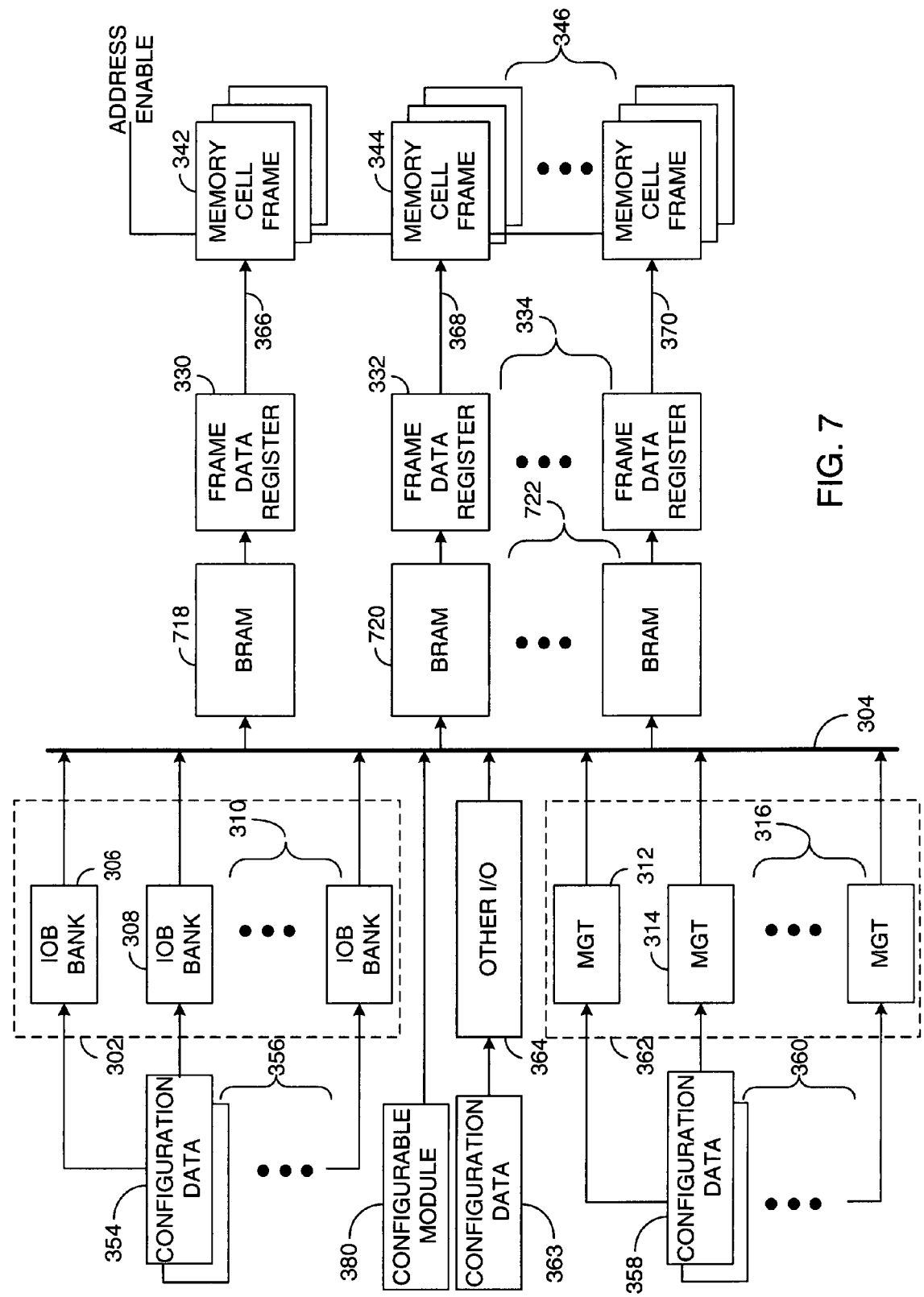
FIG. 7 illustrates an alternate embodiment of an exemplary PLD configuration controller.

Turning to FIG. 7, an alternate embodiment of a configuration controller is exemplified, whereby instead of using LUT RAM resources as the indirect connection to the configuration memory space, dedicated Random Access Memory Blocks (BRAM) 718-722, as discussed above in relation to BRAMs 103 of FIG. 1, may be utilized to implement the indirect connection. BRAMs 718-722 have adequate memory to store a plurality of configuration data frames and further provide dual-port functionality, whereby write and read operations are fully independent except that the configuration data frames are shared between the write and read operations.

BRAMs 718-722 also contain address sequencing and control circuitry that facilitates first-in, first-out (FIFO) operation. As such, the configuration data of configuration data blocks 354-360, and/or 363, may be sequentially transferred to BRAMs 718-722 as a plurality of variable data width, configuration data words. In one embodiment, BRAMs 718-722 may be configured to receive configuration data words having a data width of, for example, 32 bits. In such an instance, a plurality of configuration data frames may be stored within BRAMs 718-722, whereby the number of configuration data frames that may be stored within BRAMs 718-722 depends upon the memory depth of BRAMs 718-722. Thus, BRAM 718 may contain configuration data frames bound for frame data register 330 and associated memory cell frame set 342. Thus, a reconfigurable module may be selected and reconfigured without requiring any further transfer of configuration data frames from configuration data blocks 354-360 and/or 363.

Figure 8:
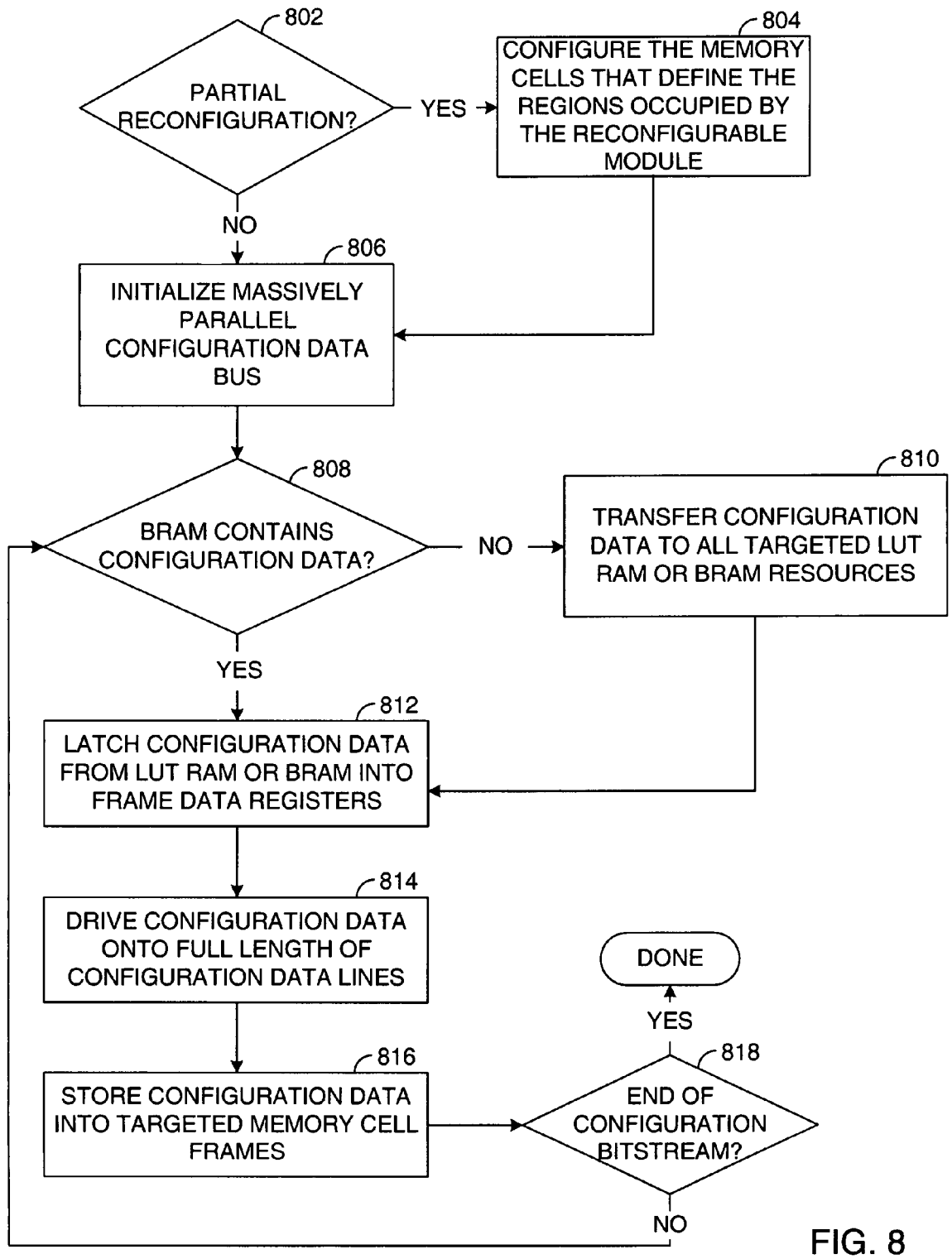
FIG. 8 illustrates an exemplary flow diagram of a method to perform full, or partial, reconfiguration using the configuration controllers of FIGS. 5 and/or 7.

Turning to FIG. 8, an exemplary flow diagram is illustrated, whereby existing LUT RAM and/or BRAM resources may be utilized to provide an indirect connection to the configuration memory space as discussed above in relation to FIGS. 5 and 7, respectively. It is noted, that the configuration controllers of FIGS. 5 and 7 are generally configured after power-up through a standard configuration process that uses a dedicated configuration controller, such as the conventional configuration controller as exemplified in FIG. 2.

Steps 802-806 are virtually identical to steps 402-406, respectively, as discussed above in relation to FIG. 4. In step 808, a determination is made as to whether BRAM resources are to be utilized as a configuration data repository and whether the configuration data frames that are needed to implement the pending reconfiguration event are currently present within the BRAM resources. If BRAM resources are to be used, and if the BRAM resources contain the correct configuration data frames, then no transfer of configuration data frames from configuration data blocks 354-360 and/or 363 is necessary. However, if the configuration data frames are not present within the BRAM resources, or if LUT RAM resources are used instead of BRAM resources, then step 810 is executed, whereby the multiplicity of configuration data frames are transferred from configuration data blocks 354-360 and/or 363 to LUT RAMs 518-522 or to BRAMs 718-722, as defined by the height of the configuration memory space.

In step 812, the configuration data frames are read back from the LUT RAM or BRAM resources, which is to say in other words, that the configuration data frames are latched into frame data registers 330-334 and then driven onto configuration datalines 366-370 as in step 814. Remaining steps 816-818 are virtually identical to steps 412-416, respectively, and operate as discussed above in relation to FIG. 4.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A programmable logic device, comprising:
   a first configuration data router coupled to receive a first plurality of configuration data frames;
   a second configuration data router, the second configuration data router being at least partially defined in response to the first plurality of configuration data frames and comprising a plurality of input/output devices coupled to receive the second plurality of configuration data frames, the second plurality of configuration data frames being externally transmitted to the programmable logic device, wherein the plurality of input/output devices includes a plurality of banks of input/output blocks;
   a configuration memory space coupled to the second configuration data router and adapted to receive a second plurality of configuration data frames to define a reconfigurable module within the programmable logic device, the configuration memory space including,
a plurality of frame data registers, each frame data register being adapted to simultaneously receive one configuration data frame of the second plurality of configuration data frames; and
a plurality of memory cell frame sets, each memory cell frame set being coupled to one of the plurality of frame data registers to simultaneous receive one configuration data frame of the second plurality of configuration data frames to define a portion of the reconfigurable module.

2. The programmable logic device of claim 1, wherein the plurality of input/output devices includes a plurality of multigigabit transceivers.

3. The programmable logic device of claim 1, wherein the plurality of input/output devices includes a plurality of wireless transceivers.

4. The programmable logic device of claim 1, wherein the plurality of input/output devices includes a plurality of optical transceivers.

5. The programmable logic device of claim 1, wherein the second configuration data router further comprises an interconnect bus coupled to the plurality of input/output devices.

6. The programmable logic device of claim 5, wherein the second configuration data router further comprises a plurality of data word converters coupled to the interconnect bus.

7. The programmable logic device of claim 5, wherein the second configuration data router further comprises a plurality of random access memory resources coupled to the interconnect bus.

8. The programmable logic device of claim 7, wherein the plurality of random access memory resources includes lookup-table random access memory resources.

9. The programmable logic device of claim 7, wherein the plurality of random access memory resources includes random access memory blocks, the random access memory blocks being adapted to store the second plurality of configuration data frames.

10. The programmable logic device of claim 1, wherein the second configuration data router is adapted to receive the second plurality of configuration data frames from within the programmable logic device.

11. A method of reconfiguring a programmable logic device, comprising:
transferring a first plurality of configuration data frames using a first configuration data router to define a second configuration data router;
transferring a second plurality of configuration data frames using the second configuration data router to define a reconfigurable module within the programmable logic device;
simultaneously applying a portion of configuration data frames of the second plurality of configuration data frames to respective memory cell frames of a plurality of memory cell frame sets, the simultaneously applying comprising distributing the portion of configuration data frames to a plurality of frame data registers using data word converters, each frame data register being adapted to configure multiple memory cell frames of a respective memory cell frame set; and
wherein the reconfigurable module is defined by the second plurality of configuration data frames stored within the plurality of memory cell frame sets.

12. The method of claim 11, wherein simultaneously applying a portion of configuration data frames of the second plurality of configuration data frames comprises distributing the portion of configuration data frames to a plurality of frame data registers using random access memory resources, each frame data register being adapted to configure multiple memory cell frames of a respective memory cell frame set.

13. An integrated circuit, comprising:
a configuration data router coupled to receive a plurality of configuration data frames, the configuration data router including,
an interconnect bus adapted to provide the plurality of configuration data frames to define a reconfigurable module within the integrated circuit;
a plurality of frame data registers coupled to the interconnect bus, each frame data register coupled to receive a configuration data frame of the plurality of configuration data frames and adapted to apply the configuration data frame to a respective memory cell frame set to simultaneously define one memory cell frame in each memory cell frame set; and
data word converters coupled between the interconnect bus and the plurality of frame data registers
wherein the reconfigurable module is defined by the plurality of configuration data frames stored within the memory cell frame sets.

14. The integrated circuit of claim 13, further comprising a configurable module coupled to the configuration data router and adapted to provide the plurality of configuration data frames from within the integrated circuit.

15. The integrated circuit of claim 13, wherein the configuration data router comprises input/output devices coupled to receive the plurality of configuration data frames externally transmitted to the integrated circuit.

16. The integrated circuit of claim 13, further comprising random access memory resources coupled between the interconnect bus and the plurality of frame data registers and adapted to store the plurality of configuration data frames.

* * * * *